(12) United States Patent
Maeda et al.

(10) Patent No.: US 8,598,707 B2
(45) Date of Patent: Dec. 3, 2013

(54) SOLDER ALLOY AND SEMICONDUCTOR DEVICE

(75) Inventors: Akira Maeda, Chiyoda-ku (JP); Kenji Otsu, Chiyoda-ku (JP); Akira Yamada, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 141 days.

(21) Appl. No.: 13/125,369

(22) PCT Filed: Apr. 13, 2009

(86) PCT No.: PCT/JP2009/057438
§ 371 (c)(1),
(2), (4) Date: Apr. 21, 2011

(87) PCT Pub. No.: WO2010/047139
PCT Pub. Date: Apr. 29, 2010

(65) Prior Publication Data
US 2011/0198755 A1 Aug. 18, 2011

(30) Foreign Application Priority Data

Oct. 24, 2008 (JP) ................................ 2008-274545

(51) Int. Cl.
*H01L 23/48* (2006.01)
*H01L 23/52* (2006.01)
*H01L 29/40* (2006.01)

(52) U.S. Cl.
USPC .............. 257/772; 257/779; 257/323.023

(58) Field of Classification Search
USPC .................. 257/772, 779, E23.023
See application file for complete search history.

(56) References Cited

U.S. PATENT DOCUMENTS

| 4,758,407 | A | 7/1988 | Ballentine et al. | |
|---|---|---|---|---|
| 5,833,920 | A | 11/1998 | Nakanishi et al. | |
| 2002/0066583 | A1 | 6/2002 | Soga et al. | |
| 2004/0079194 | A1* | 4/2004 | Nakata et al. | 75/255 |
| 2006/0067852 | A1* | 3/2006 | Suh et al. | 420/555 |
| 2007/0122646 | A1* | 5/2007 | Liu et al. | 428/646 |
| 2007/0295528 | A1* | 12/2007 | Nishi et al. | 174/126.4 |
| 2008/0159903 | A1* | 7/2008 | Lewis et al. | 420/561 |
| 2008/0159904 | A1* | 7/2008 | Lewis et al. | 420/561 |

(Continued)

FOREIGN PATENT DOCUMENTS

| CN | 101011782 A | 8/2007 |
|---|---|---|
| CN | 101214591 A | 7/2008 |

(Continued)

OTHER PUBLICATIONS

International Search Report issued Jul. 7, 2009 in PCT/JP09/57438 filed Apr. 13, 2009.

(Continued)

*Primary Examiner* — Teresa M Arroyo
(74) *Attorney, Agent, or Firm* — Oblon, Spivak, McClelland, Maier & Neustadt, L.L.P.

(57) ABSTRACT

A solder alloy includes 5 to 15% by mass of Sb, 3 to 8% by mass of Cu, 0.01 to 0.15% by mass of Ni, and 0.5 to 5% by mass of In. The remainder thereof includes Sn and unavoidable impurities. Thereby, highly reliable solder alloy and semiconductor device suppressing a fracture in a semiconductor element and improving crack resistance of a solder material can be obtained.

16 Claims, 5 Drawing Sheets

(56) References Cited

U.S. PATENT DOCUMENTS

| | | | |
|---|---|---|---|
| 2010/0289148 A1* | 11/2010 | Soga et al. | 257/772 |
| 2011/0120769 A1* | 5/2011 | Sakatani et al. | 174/84 R |
| 2012/0018048 A1* | 1/2012 | Yamashita et al. | 148/24 |
| 2012/0055586 A1* | 3/2012 | McIsaac et al. | 148/24 |
| 2012/0222893 A1* | 9/2012 | Hwang et al. | 174/257 |

FOREIGN PATENT DOCUMENTS

| | | |
|---|---|---|
| CN | 101239425 A | 8/2008 |
| EP | 1 760 783 A2 | 3/2007 |
| JP | 2001 284792 | 10/2001 |
| JP | 2001 334384 | 12/2001 |
| JP | 2002 76606 | 3/2002 |
| JP | 2004 141910 | 5/2004 |
| JP | 2004 298931 | 10/2004 |
| JP | 2007 067158 | 3/2007 |

OTHER PUBLICATIONS

Chinese Office Action issued Nov. 14, 2012, in China Patent Application No. 200980141900.5 (with English translation).

* cited by examiner (A)

(B)

(A)

(B)

SOLDER ALLOY AND SEMICONDUCTOR DEVICE

TECHNICAL FIELD

The present invention relates to a solder alloy and a semiconductor device, and in particular to a solder alloy not containing lead (lead-free solder alloy) suitable for joining a semiconductor element to an electrode of an electronic circuit, and a semiconductor device using the solder alloy.

BACKGROUND ART

Recently, the demand for reliability of semiconductor devices is increasingly growing, and in particular improvement of heat cycle resistance properties is required for a junction between a semiconductor element and a circuit board having a large difference in thermal expansion coefficient. Conventionally, semiconductor elements having substrates made of silicon (Si) or gallium arsenide (GaAs) have been commonly used, and they are operated at a temperature of 100° C. to 125° C. As a solder material joining these elements to electrodes of an electronic circuit, 95Pb-5Sn (% by mass) has been used for Si devices and 80Au-20Sn (% by mass) or the like has been used for gallium arsenide devices, considering crack resistance to repeated thermal stress due to a difference in thermal expansion between a semiconductor element and a circuit board, a high melting point for dealing with multi-stage solder joining used during assembly, pollution resistance of the devices, and the like. However, 95Pb-5Sn containing a large amount of harmful lead (Pb) is problematic from the viewpoint of reducing environmental load, and an alternative to 80Au-20Sn has been strongly desired in terms of soaring prices of precious metals and reserves thereof.

On the other hand, development of devices having substrates made of silicon carbide (SiC) or gallium nitride (GaN) as next-generation devices has been actively pursued, from the viewpoint of energy saving. These devices are designed to be operated at a temperature of not less than 175° C. from the viewpoint of reducing loss, and it is said that they will be operated at 300° C. in the future.

For the above demand, a high-temperature solder alloy having a high melting point and excellent heat resistance is required. Such a high-temperature solder alloy is disclosed, for example, in Japanese Patent Laying-Open No. 2004-298931. In the publication, a lead-free, high-temperature solder alloy composed of 10 to 40% by mass of Sb, 0.5 to 10% by mass of Cu, and the remainder including Sn, and an electronic component joined using the solder alloy are disclosed. In addition, a solder alloy containing Ni, Co, Fe, Mo, Cr, Mn, Ag, and Bi as elements for improving mechanical strength is disclosed. Further, a solder alloy containing P, Ge, and Ga as elements for suppressing oxidization is disclosed.

In addition, a technique for obtaining solder joining strength that is satisfactory even at a high temperature of 200° C. is disclosed, for example, in Japanese Patent Laying-Open No. 2007-67158. In a semiconductor device according to the publication, materials to be connected plated with Ni-based plating are connected using an Sn-based solder foil containing a phase of a Cu—Sn compound (for example, $Cu_6Sn_5$) at a temperature from room temperature to 200° C., and thereby a compound layer mainly composed of the Cu—Sn compound is formed. The compound layer serves as a barrier layer for the Ni-based plating and the Sn-based solder, and suppresses growth of the compound by a reaction at a connection interface. Further, in the examples, a solder foil in which not less than 3% by mass of Cu is contained in Sn or Sn-3Ag (% by mass) is brought into contact with the Ni-based plating, heated and melted, and thus joined.

PRIOR ART DOCUMENTS

Patent Documents

Patent Document 1: Japanese Patent Laying-Open No. 2004-298931

Patent Document 2: Japanese Patent Laying-Open No. 2007-67158

SUMMARY OF THE INVENTION

Problems to be Solved by the Invention

However, the solder alloy described in Patent Document 1 has a problem that, since a solder material is hard and does not relax stress, a semiconductor element may be fractured due to heat cycles.

In addition, the semiconductor device described in Patent Document 2 has a problem that, since a solder material is soft and susceptible to fracture, crack resistance inside the solder material is low.

The present invention has been made in view of the aforementioned problems, and one object of the present invention is to provide highly reliable solder alloy and semiconductor device suppressing a fracture in a semiconductor element and improving crack resistance of a solder material by controlling the hardness of the solder material.

Means for Solving the Problems

A solder alloy according to the present invention includes 5 to 15% by mass of Sb, 3 to 8% by mass of Cu, 0.01 to 0.15% by mass of Ni, and 0.5 to 5% by mass of In. The remainder includes Sn and unavoidable impurities.

Effects of the Invention

In the solder alloy according to the present invention, by adding In in the range of 0.5 to 5% by mass, a soft In-rich phase is dispersed inside a solder material that is too hardened by Sb added to improve crack resistance. Thereby, ductility is strengthened and the solder material is appropriately softened, and the hardness of the solder material is controlled. This suppresses a fracture in a semiconductor element, and improves the crack resistance of the solder material.

MODES FOR CARRYING OUT THE INVENTION

Hereinafter, an embodiment of the present invention will be described with reference to the drawings.

Firstly, a configuration of a solder alloy according to the present embodiment and a semiconductor device using the solder alloy will be described.

Figure 1:
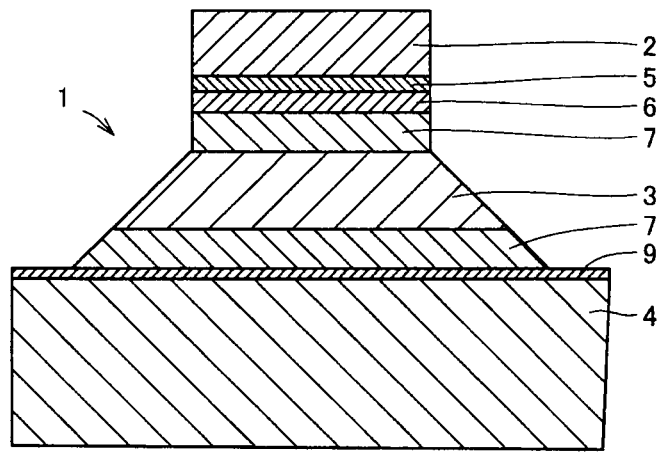
FIG. 1 is a schematic cross sectional view of a semiconductor device using a solder alloy in accordance with an embodiment of the present invention.

FIG. 1 is a schematic cross sectional view of a semiconductor device 1 along a diagonal line when seen in plane. Referring to FIG. 1, semiconductor device 1 according to the present embodiment mainly has a silicon chip 2 as an example of a semiconductor element, a solder layer 3 as a solder alloy, a circuit board 4 as a metal electrode, an ohmic layer 5, a metallization layer 6, an alloy layer 7, and an Ni (nickel) plating layer 9.

In semiconductor device 1, silicon chip 2 is joined to circuit board 4 with solder layer 3 interposed therebetween. Ohmic layer 5, metallization layer 6, and alloy layer 7 are formed between silicon chip 2 and solder layer 3. Ohmic layer 5 is provided to cause contact between a semiconductor of silicon chip 2 and a metal to be ohmic contact, and is formed to be in contact with silicon chip 2. Metallization layer 6 is provided to obtain good contact between ohmic layer 5 and solder layer 3, and is formed to be in contact with ohmic layer 5. Alloy layer 7 is a layer generated between solder layer 3 and metallization layer 6 when silicon chip 2 is joined to circuit board 4 using solder layer 3.

As ohmic layer 5, for example, Ti (titanium) with a thickness of about 100 nm is used. As metallization layer 6, for example, Ni (nickel) with a thickness of about 500 nm is used. As alloy layer 7, for example, a Ni (nickel)-Sn (tin)-Cu (copper) compound phase is formed, and then a mixed phase of a Cu—Sn compound phase and an Sn—Sb (antimony) containing phase is formed, from the silicon chip 2 side. Solder layer 3 is made of a lead-free solder alloy including 5 to 15% by mass of Sb, 3 to 8% by mass of Cu, 0.01 to 0.15% by mass of Ni, 0.5 to 5% by mass of In, and the remainder including Sn and unavoidable impurities.

Ni plating layer 9 and alloy layer 7 are formed between circuit board 4 and solder layer 3. Ni plating layer 9 is a layer formed on a surface of circuit board 4 by electrolytic Ni plating, and has a thickness of, for example, about 5 μm Alloy layer 7 is a layer generated between solder layer 3 and Ni plating layer 9 when silicon chip 2 is joined to circuit board 4 using solder layer 3. As alloy layer 7, for example, a Ni—Sn—Cu compound phase is formed, and then a mixed phase of a Cu—Sn compound phase and an Sn—Sb containing phase is formed, from the circuit board 4 side.

Next, a method of manufacturing semiconductor device 1 will be described.

Ohmic layer 5 and metallization layer 6 are sequentially stacked and formed on a surface of silicon chip 2 having a thickness of 0.25 mm and measuring 7 mm per side, for example. Further, Ni plating layer 9 is formed by electrolytic Ni plating on the surface of circuit board 4 made of a copper block having a thickness of 1 mm and measuring 10 mm per side, for example.

Then, silicon chip 2 and circuit board 4 are joined using solder layer 3. To perform the solder joining, firstly, a solder pellet to serve as solder layer 3 is placed on the surface of circuit board 4 on which Ni plating layer 9 is formed. The solder pellet is made of an alloy with a composition of, for example, Sn-10Sb-5Cu-0.1Ni-1In (indium)-0.05P (phosphorus) (% by mass), and a flux is applied to both surfaces thereof. The solder pellet has dimensions having a thickness of 0.1 mm and measuring 8 mm per side, for example.

Silicon chip 2 is placed on the solder pellet described above. On this occasion, silicon chip 2 is placed such that metallization layer 6 comes into contact with the solder pellet.

Circuit board 4, the solder pellet, and silicon chip 2 stacked in this state are placed on a hot plate set at a temperature of 280° C., with the circuit board 4 side down, and heated for five minutes. Thereby, the solder pellet is melted and becomes solder layer 3 in a melted state. Further, a component within metallization layer 6 and a component within solder layer 3 are mutually diffused to form alloy layer 7 between metallization layer 6 and solder layer 3. Furthermore, a component within Ni plating layer 9 and a component within solder layer 3 are mutually diffused to form alloy layer 7 also between Ni plating layer 9 and solder layer 3. By terminating the heating, solder layer 3 in a melted state is cooled and solidified.

Through the process described above, semiconductor device 1 according to the present embodiment is manufactured.

It is to be noted that the above description "Sn-10Sb-5Cu-0.1Ni-1In-0.05P (% by mass)" refers to a composition including 10% by mass of Sb, 5% by mass of Cu, 0.1% by mass of Ni, 1% by mass of In, 0.05% by mass of P, and the remainder including Sn and unavoidable impurities. In the description below, a description similar to the above description will refer to a similar composition in terms of % by mass.

Figure 2:
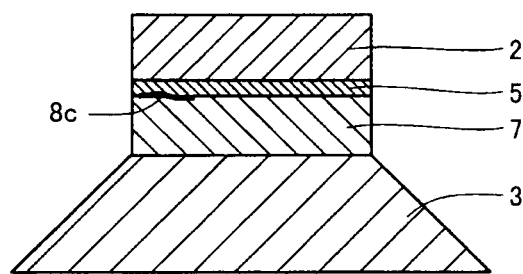
FIG. 2 is an enlarged schematic cross sectional view of a junction between a silicon chip and a solder layer in which a metallization layer disappears by diffusion in accordance with the embodiment of the present invention.

Next, a mechanism of occurrence of a fracture in silicon chip 2 in semiconductor device 1 having the same configuration as that in FIG. 1 will be described with reference to FIGS. 2 to 4, to explain an index for evaluating crack resistance.

The mechanism of occurrence of a fracture in silicon chip 2 is influenced by delamination that occurs between ohmic layer 5 and alloy layer 7, and a crack that occurs between alloy layer 7 and solder layer 3.

Firstly, delamination that occurs between ohmic layer 5 and alloy layer 7 will be described. FIG. 2 is an enlarged schematic cross sectional view of a junction between silicon chip 2 and solder layer 3 after the semiconductor device is held at a high temperature of about 200° C. for a long time until the metallization layer disappears. Referring to FIG. 2, as a result of being held at a high temperature for a long time as described above, the metallization layer between alloy layer 7 and ohmic layer 5 disappears and alloy layer 7 and ohmic layer 5 are in direct contact with each other. Further, in this case, although the thickness of ohmic layer 5 does not change when compared to that in FIG. 1, alloy layer 7 becomes thicker as it grows by incorporating the metallization layer and a portion of solder layer 3 by thermal diffusion. When ohmic layer 5 and alloy layer 7 are in direct contact with each other, adhesion strength between ohmic layer 5 and alloy layer 7 is reduced, and thus delamination 8c occurs between ohmic layer 5 and alloy layer 7 with a relatively small force.

Secondly, a crack that occurs between alloy layer 7 and solder layer 3 due to heat cycle treatment will be described. FIG. 3 shows a state of occurrence of cracks 8a, 8b in a solder junction after heat cycle treatment of about 500 cycles is performed, where one cycle includes cooling at −50° C. for 30 minutes and heating at 200° C. for 30 minutes. Referring to FIG. 3, when the heat cycle treatment is performed on semiconductor device 1, cracks 8a, 8b occur between silicon chip 2 and solder layer 3, which have the largest difference in thermal expansion coefficient among silicon chip 2, solder layer 3, and circuit board 4, from the periphery.

Thirdly, the mechanism of occurrence of a fracture in silicon chip 2 due to delamination 8c described with reference to FIG. 2 and cracks 8a, 8b described with reference to FIG. 3 will be described. FIG. 4 shows a state of occurrence of cracks in a solder junction and silicon chip 2 of semiconductor device 1 in which metallization layer 6 disappears by thermal diffusion during heat cycles. Referring to FIG. 4, cracks 8a, 8b occur after a period of time since the start of heat cycles. In addition, delamination 8c occurs at an interface between ohmic layer 5 and alloy layer 7 after metallization layer 6 disappears. Then, cracks 8a, 8b, and delamination 8c are combined, and as a result a fracture 8d occurs in silicon chip 2.

Next, crack resistance of semiconductor device 1 will be described. The crack resistance of semiconductor device 1 is influenced by crack resistance of solder layer 3 as a solder material and a fracture in silicon chip 2 as a semiconductor element.

Figure 3:
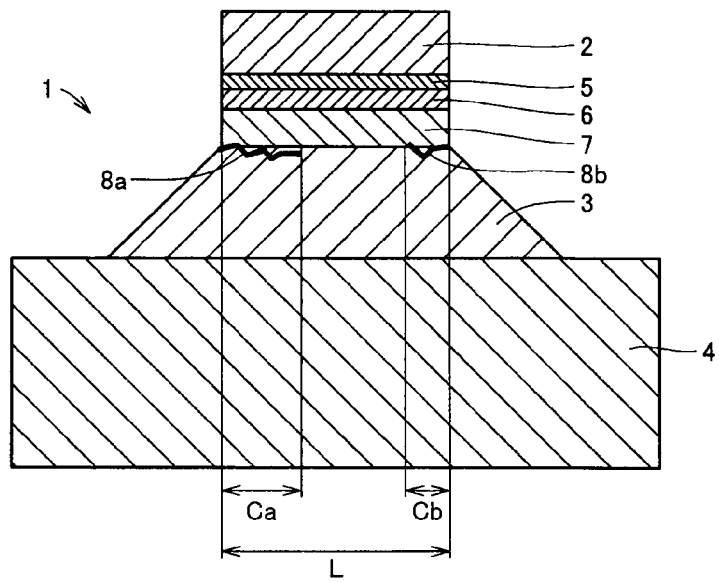
FIG. 3 is a schematic cross sectional view showing a state of occurrence of cracks in a solder junction of the semiconductor device in accordance with the embodiment of the present invention.

As shown in FIG. 3, projected lengths of cracks 8a and 8b will be referred to as Ca and Cb, respectively. Generally, cracks 8a, 8b run substantially linearly through the solder layer 3 side at an interface between silicon chip 2 and solder layer 3, more specifically an interface between alloy layer 7 and solder layer 3. Thus, a projection length in a case where a crack runs from one end to the other end of the interface between alloy layer 7 and solder layer 3 is substantially equal to a joined length L between silicon chip 2 and solder layer 3. Therefore, crack resistance due to heat cycles can be represented by (Ca+Cb)/L×100(%) in a case where a cross section of semiconductor device 1 along the diagonal line is observed, and this will be referred to as a crack ratio (%).

Figure 4:
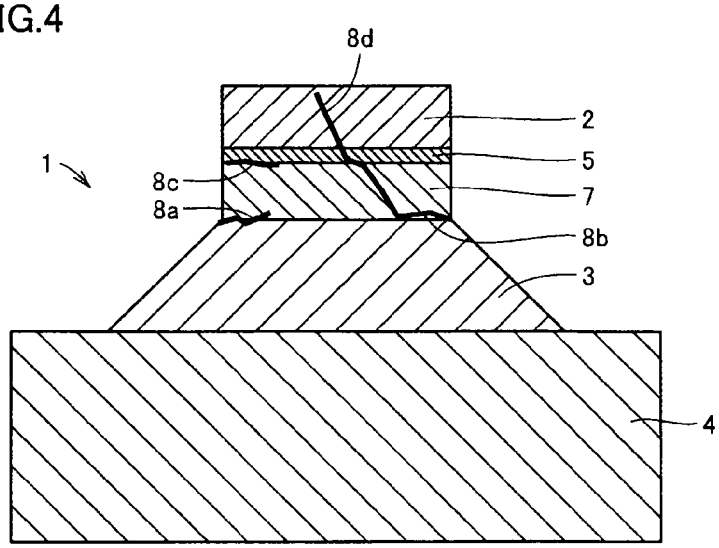
FIG. 4 is a schematic cross sectional view showing a state of occurrence of cracks in the silicon chip of the semiconductor device in accordance with the embodiment of the present invention.

Since generally thermal diffusion does not occur uniformly within a solder alloy, delamination 8c shown in FIG. 4 may partially occur at a plurality of locations. In that case, before cracks 8a and 8b are combined and run through the interface between alloy layer 7 and solder layer 3, cracks 8a, 8b, and delamination 8c are combined, resulting in fracture 8d. As a result, silicon chip 2 is fractured and does not operate, and thus the crack resistance of semiconductor device 1 is reduced even if the crack ratio described above is low.

Further, if there is a void within the solder junction, a crack starting from that portion occurs. In addition, a crack reaching the void runs at once. Thus, if there is a void within the solder junction, the crack resistance of solder layer 3 and the crack resistance of semiconductor device 1 are reduced.

Therefore, the crack resistance of semiconductor device 1 can be represented by a fracture in silicon chip 2 due to heat cycles and the number of cycles when the fracture occurs, the crack ratio obtained by cross section observation, and a void ratio of the solder material (solder wettability) after manufacturing semiconductor device 1.

The number of cycles when a fracture occurs refers to the number of cycles in heat cycles when a chip fracture is confirmed. In addition, the void ratio refers to a ratio of an area of a void to a cross sectional area of the solder material as described later in detail. The void ratio serves as an index for solder wettability, as good solder wettability leads to less inclusion of air bubbles and suppresses occurrence of a void.

Next, a reason for limiting chemical components of the solder alloy according to the present embodiment will be described based on the index for crack resistance described above.

Firstly, the content of Sb (5 to 15% by mass) will be described.

When Sb is added to Sn, tensile strength is significantly improved if Sb is added by not less than 5% by mass, and continues to be improved with an increase in an added amount of Sb. On the other hand, elongation is reduced with an increase in the added amount of Sb, and considerably reduced if Sb is added by 20% by mass. If the solder material has a high tensile strength and a low elongation, stress is not relaxed by solder layer 3, and silicon chip 2 is fractured. Thus, it is desirable for the crack resistance of semiconductor device 1 that solder layer 3 has both a high tensile strength and a high elongation. Hence, the crack resistance of semiconductor device 1 is excellent when the content of Sb is 5 to 15% by mass.

Further, with an increase in the added amount of Sb, a liquidus temperature increases, whereas a solidus temperature does not increase very much. Since a void is likely to occur in a solid-liquid coexistence region (a region at not less than the solidus temperature and not more than the liquidus temperature), heating to not less than the liquidus temperature is desirable. Since the liquidus temperature when the content of Sb is 15% by mass is 300° C., and an upper limit of an ordinary thermal heater is 300° C., heating can be performed without using a special heating device if Sb is added by not more than 15% by mass, which is advantageous in terms of cost.

Further, since metallization layer 6 has a significantly high diffusion rate at not less than the solidus temperature, it is desirable that the solid-liquid coexistence region (region at not less than the solidus temperature and not more than the liquidus temperature) is narrow. The solid-liquid coexistence region in a case where the content of Sb is 15% by mass has a temperature difference of 58° C., which is narrower than 83° C. in a case where the content of Sb is 20% by mass.

Therefore, addition of Sb by 5 to 15% by mass achieves good crack resistance and good balance in mechanical strength, and is advantageous in terms of cost.

Secondly, the content of Cu (3 to 8% by mass) and the content of Ni (0.01 to 0.15% by mass) will be described.

To begin with, the content of Cu (3 to 8% by mass) will be described. With an increase in an added amount of Cu, ductility is reduced, the void ratio is increased, and a remaining Ni thickness is increased. The reduction of ductility is caused because, due to addition of Cu, an intermetallic compound phase such as $Cu_6Sn_5$ precipitates in a grain boundary of Sn that accounts for a large portion, a precipitation amount thereof is increased with an increase in the added amount of Cu, and thus grain boundary sliding of Sn is less likely to occur. The increase in the void ratio is caused because the liquidus temperature increases with an increase in the added amount of Cu, viscosity increases with an increase in a precipitated solid phase, and thus gas of the flux is less likely to be released. Further, the increase in the remaining Ni thickness is caused because added Cu moves to a joined interface within the melted solder and generates a ternary alloy together with Ni as the metallization layer and Sn as the main component, which has a growth rate lower than that of a binary alloy made of Ni and Sn.

An average of the remaining Ni thickness of metallization layer 6 is significantly increased when the added amount of Cu is not less than 3% by mass. Thereby, an effect of suppressing diffusion of Ni of metallization layer 6 is exhibited. However, when the added amount of Cu is not less than 10% by mass, voids are significantly increased. For these reasons, highly reliable joining is obtained by adding 3 to 8% by mass of Cu to an alloy based on Sn-10Sb-1In.

It is to be noted that, as the added amount of Cu, around 5% by mass is most desirable, where excellent balance among the effect of suppressing diffusion of Ni, the void ratio, and ductility is achieved.

Further, also in the heat cycle treatment, if an added amount of Ni is 0.01 to 0.15% by mass and the added amount of Cu is 3 to 8% by mass, a chip fracture does not occur and the crack ratio is not more than 50%.

Next, the content of Ni (0.01 to 0.15% by mass) will be described. With an increase in the added amount of Ni, the average of the remaining Ni thickness is increased. Specifically, the metallization layer has a slower diffusion rate, and joining strength at a high temperature is kept longer, that is, heat resistance is more excellent. Its effect is significant at not less than 0.01% by mass. On the other hand, when the added amount of Ni is not less than 0.2% by mass, voids are significantly increased. Since increased voids are disadvantageous to release heat generated in the semiconductor device, at present an added amount of not more than about 0.15% by mass serves as a guideline. Therefore, highly reliable joining is obtained by controlling the added amount of Ni to be not more than 0.15% by mass. As to the lower limit of the added amount of Ni, not less than 0.01% by mass where a significant effect is exhibited is desirable, although an effect is also obtained even if the lower limit thereof is less than 0.01% by mass. Further, as the added amount of Ni, around 0.1% by mass is most desirable, which is close to a limit of solid solubility into Sn at a soldering temperature of 270° C.

Thirdly, the content of In (0.5 to 5% by mass) will be described.

Since stress is not relaxed in a solder material that is too hardened by Sb added to improve crack resistance, a chip fracture occurs in the semiconductor element. By adding In, an In phase is dispersed and ductility is strengthened, and thereby a metal structure which is less likely to be fractured and relaxes stress is formed. On the other hand, if In is added, wettability of the solder material is improved, because a melting point is reduced and thus reactivity is improved. However, since In is an active element, if In is added too much, the solder material is oxidized and wettability is reduced. Further, if a solder paste is used, a pot life is reduced, that is, long-term preservation properties are reduced. Furthermore, there is concern about a reduction in crack resistance due to a reduction of the melting point, a reduction in heat resistance, and softening at a high temperature. Therefore, an appropriate content of In is needed.

The void ratio is drastically reduced by adding In by not less than 0.5% by mass. Further, the void ratio is increased a little by adding In by not less than 8% by mass. Therefore, it is desirable that the content of In is 0.5 to 5% by mass. Considering the cost, it is more desirable that the content of In is 0.5 to 1% by mass.

Although Ti (titanium) is used as the ohmic layer in the present embodiment, a metal other than Ti, for example, Ni (nickel), Al (aluminum), Mo (molybdenum), or a compound such as silicides of these elements including Ti, or a multilayer structure combining the same, or the like can be used. It is also possible to exclude the ohmic layer.

Next, a solder alloy characterized by containing at least one selected from the group consisting of P (phosphorus), Ge (germanium), Ga (gallium), and Bi (bismuth), by 0.01 to 1% by mass in total will be described.

Semiconductor device 1 including circuit board 4 as the metal electrode connected to silicon chip 2 as the semiconductor element via the solder alloy to which at least one selected from the group consisting of P, Ge, Ga, and Bi is added by 0.01 to 1% by mass in total, as solder layer 3 according to the present embodiment described above, has a void ratio that has an improvement effect of 2 to 10% in all the solder alloys.

It is to be noted that, in a solder alloy containing at least one selected from the group consisting of P, Ge, Ga, and Bi, by 0.005% by mass in total, there is no significant improvement effect. Further, in solder alloys containing at least one selected from the group consisting of P, Ge, Ga, and Bi, by 1.5% by mass and 3% by mass in total, the void ratio is increased on the contrary.

For these reasons, by adding at least one selected from the group consisting of P, Ge, Ga, and Bi, by 0.01 to 1% by mass in total, oxidization of the solder alloy can be suppressed, exhibiting the effects of reducing viscosity and reducing the void ratio.

Next, a case where Cu/Inver/Cu and Cu/Mo/Cu are used as the circuit board will be described. If Cu/Inver/Cu and Cu/Mo/Cu are used as the circuit board under conditions identical to those in the embodiment described above, the crack ratio in Cu/Inver/Cu is about half, and the crack ratio in Cu/Mo/Cu is about one third. Further, a case where Ni plating is not applied on the surface of circuit board 4 will be described. Under the conditions identical to those in the embodiment described above, both the crack ratio and diffusion of the metallization layer are improved by about 20%.

As described above, effects can be obtained irrespective of an electrode material and surface treatment.

EXAMPLES

Hereinafter, examples of the present invention will be described in detail.

Example 1

Figure 5:
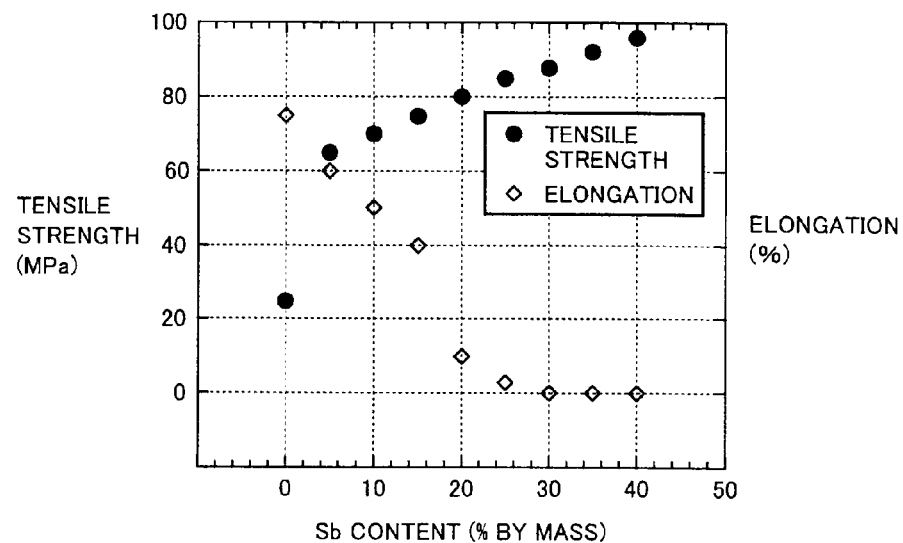
FIG. 5 is a view showing the relationship between Sb content and tensile strength and elongation.

To obtain Sn-xSb (% by mass: x=3, 5, 10, 15, 20, 25, 30, 35, 40), Sn with a purity of 99.5% and Sb with a purity of 99.9% were weighed to be 2 kg in total. Then, Sn was heated in a high-frequency melting furnace until a maximum temperature reached 700° C. Thereafter, Sb was introduced and stirred. After it was confirmed that Sb was all melted, a solder alloy was rapidly molded using a mold having a diameter of 40 mm and a length of 250 mm. After being solidified, the solder alloy was machined into a round bar having a diameter of 25 mm and a length of 180 mm using a central portion as a basis, and further machined into chuck portions each having a diameter of 25 mm and a length of 40 mm and a parallel portion having a diameter of 8 mm and a length of 90 mm for a tensile test. A tensile test was performed on the solder alloy at a tensile rate of 0.5 mm/min. FIG. 5 shows measurement results of tensile strength and elongation in the tensile test.

FIG. 5 is a view showing the relationship between Sb content and tensile strength and elongation in Example 1.

During machining of a tensile test piece described above, cut powder was taken with a drill from the vicinity of the two chuck portions, and quantitative analysis based on emission analysis was performed. As a result, it was confirmed that Sb having a value as targeted was contained, to one significant figure. It was also confirmed from an outer appearance check that there were no solder voids, surface defects, and discoloring.

Consequently, it was found that, when Sb is added to Sn, tensile strength tends to be significantly improved by adding Sb by not less than 5% by mass, and continue to be improved with an increase in the added amount of Sb, whereas elongation is reduced with an increase in the added amount of Sb, and considerably reduced by adding Sb by 20% by mass.

Table 1 shows a solidus temperature and a liquidus temperature measured using a differential scanning calorimetric analysis device (DSC), for each of molded samples described above in a case where the added amount of Sb was not more than 20% by mass (i.e., x=0, 5, 10, 15, 20) at which elongation was considerably reduced, by taking about several tens of milligrams from a substantially central portion thereof. Here, the solidus temperature is defined as a minimum temperature of a peak that appears first in a heat absorption curve obtained when heating is performed at a temperature rising rate of 5° C./min. In addition, the liquidus temperature is defined as a maximum temperature of a peak that appears first in a heat generation curve obtained when cooling is performed at a rate of 5° C./min.

TABLE 1

| Sb (% by mass) | 0 | 5 | 10 | 15 | 20 |
|---|---|---|---|---|---|
| Solidus Temperature | 232° C. | 240° C. | 242° C. | 242° C. | 242° C. |
| Liquidus Temperature | 232° C. | 242° C. | 265° C. | 300° C. | 325° C. |

Example 2

To obtain Sn-10Sb-1In-xCu-yNi (% by mass: x=0, 0.5, 1.5, 3, 5, 8, 10, y=0, 0.01, 0.05, 0.1, 0.15, 0.20), materials were weighted. Then, the materials were subjected to high-frequency melting under a nitrogen atmosphere, and it was confirmed that the temperature reached 700° C. and that no materials remained unmelted. Thereafter, an ingot was molded using a mold having a width of 20 mm, a height of 10 mm, and a length of 150 mm.

Figure 6:
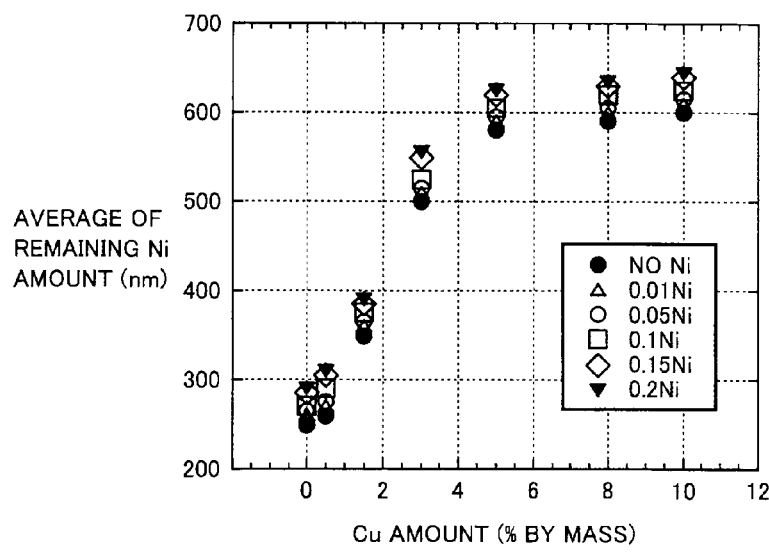
FIG. 6 is a view showing the relationship between Cu amount and an average of a remaining Ni thickness.
Figure 7:
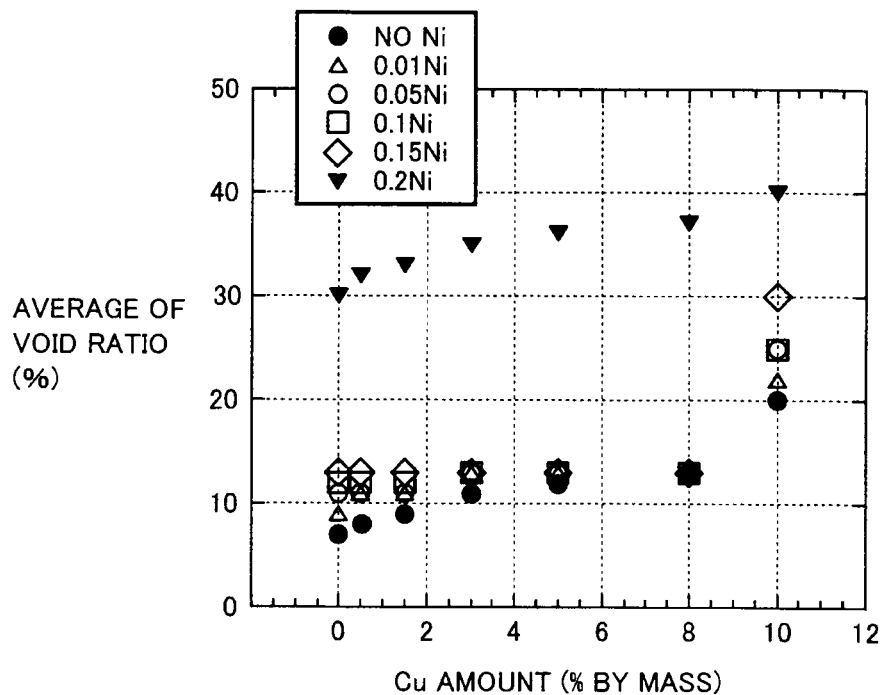
FIG. 7 is a view showing the relationship between the Cu amount and an average of a void ratio.

Cut powder was taken with a drill from both ends and a central portion of the ingot. Quantitative analysis was performed on Sb, Cu, Ni in the cut powder, based on plasma fusion emission analysis. As a result, it was confirmed that the ingot having a value as targeted was obtained, to one significant figure. Then, the ingot was introduced into a rolling mill to have a thickness of 0.1 mm. Subsequently, its surface was washed with 10% hydrochloric acid, and then fully washed with water. Thereafter, the ingot was cut with a cutter into pellets measuring 8 mm per side. On this occasion, comparative evaluation was visually made to evaluate ductility, such that an ingot partially having a fracture during rolling was indicated with a mark Δ, an ingot having no fracture during rolling was indicated with a mark ○, and the state of an ingot made of Sn-10Sb-1In (x=y=0) was indicated with a double circle mark (good). Using each ingot, 10 semiconductor devices 1 were manufactured by the manufacturing method described above. The manufactured semiconductor devices 1 were irradiated with X rays from the surface of the silicon chip using an X-ray transmission device, and an average value of the sum of areas obtained by binarizing an obtained image using an image processing device was defined as an average void ratio. Further, a central portion of each sample after a cross section of the silicon chip along a diagonal line was polished was observed with an electron microscope at a magnification of 20000 times, and the remaining Ni thickness was calculated from a photograph, based on an average at five points. Table 2 shows calculation results of an average of the remaining Ni thickness and the average void ratio averaged for each of the manufactured 10 semiconductor devices 1. FIGS. 6 and 7 are graphs showing these calculation results. FIG. 6 is a view showing the relationship between Cu amount and the average of the remaining Ni thickness in Example 2. FIG. 7 is a view showing the relationship between the Cu amount and the average of the void ratio in Example 2.

TABLE 2

|  | Comparative Example 1 | Comparative Example 2 | Comparative Example 3 | Comparative Example 4 | Comparative Example 5 | Comparative Example 6 | Comparative Example 7 |
|---|---|---|---|---|---|---|---|
| Ni Amount (% by mass) |  |  |  | 0 |  |  |  |
| Cu Amount (% by mass) | 0 | 0.5 | 1.5 | 3 | 5 | 8 | 10 |
| Ductility | ◎ | ◎ | ◎ | ○ | ○ | ○ | Δ |
| Average Void Ratio (%) | 7% | 8% | 9% | 11% | 12% | 13% | 20% |
| Average of Remaining Ni Thickness (nm) | 250 | 260 | 350 | 500 | 580 | 590 | 600 |

TABLE 3

|  | Comparative Example 8 | Comparative Example 9 | Comparative Example 10 | Example 1 | Example 2 | Example 3 | Comparative Example 11 |
|---|---|---|---|---|---|---|---|
| Ni Amount (% by mass) |  |  |  | 0.01 |  |  |  |
| Cu Amount (% by mass) | 0 | 0.5 | 1.5 | 3 | 5 | 8 | 10 |
| Ductility | ◎ | ◎ | ○ | ○ | ○ | ○ | Δ |

TABLE 3-continued

|  | Comparative Example 8 | Comparative Example 9 | Comparative Example 10 | Example 1 | Example 2 | Example 3 | Comparative Example 11 |
|---|---|---|---|---|---|---|---|
| Average Void Ratio (%) | 9% | 11% | 11% | 13% | 13% | 13% | 22% |
| Average of Remaining Ni Thickness (nm) | 260 | 270 | 360 | 510 | 590 | 600 | 610 |

TABLE 4

|  | Comparative Example 12 | Comparative Example 13 | Comparative Example 14 | Example 4 | Example 5 | Example 6 | Comparative Example 15 |
|---|---|---|---|---|---|---|---|
| Ni Amount (% by mass) |  |  |  | 0.05 |  |  |  |
| Cu Amount (% by mass) | 0 | 0.5 | 1.5 | 3 | 5 | 8 | 10 |
| Ductility | ◎ | ◎ | ○ | ○ | ○ | ○ | Δ |
| Average Void Ratio (%) | 11% | 11% | 11% | 13% | 13% | 13% | 25% |
| Average of Remaining Ni Thickness (nm) | 265 | 275 | 365 | 515 | 595 | 605 | 615 |

TABLE 5

|  | Comparative Example 16 | Comparative Example 17 | Comparative Example 18 | Example 7 | Example 8 | Example 9 | Comparative Example 19 |
|---|---|---|---|---|---|---|---|
| Ni Amount (% by mass) |  |  |  | 0.1 |  |  |  |
| Cu Amount (% by mass) | 0 | 0.5 | 1.5 | 3 | 5 | 8 | 10 |
| Ductility | ○ | ○ | ○ | ○ | ○ | ○ | Δ |
| Average Void Ratio (%) | 12% | 12% | 12% | 13% | 13% | 13% | 25% |
| Average of Remaining Ni Thickness (nm) | 270 | 290 | 375 | 525 | 605 | 620 | 625 |

TABLE 6

|  | Comparative Example 20 | Comparative Example 21 | Comparative Example 22 | Example 10 | Example 11 | Example 12 | Comparative Example 23 |
|---|---|---|---|---|---|---|---|
| Ni Amount (% by mass) |  |  |  | 0.15 |  |  |  |
| Cu Amount (% by mass) | 0 | 0.5 | 1.5 | 3 | 5 | 8 | 10 |
| Ductility | ○ | ○ | ○ | ○ | ○ | ○ | Δ |
| Average Void Ratio (%) | 13% | 13% | 13% | 13% | 13% | 13% | 30% |
| Average of Remaining Ni Thickness (nm) | 285 | 305 | 385 | 550 | 620 | 630 | 640 |

TABLE 7

|  | Comparative Example 24 | Comparative Example 25 | Comparative Example 26 | Comparative Example 27 | Comparative Example 28 | Comparative Example 29 | Comparative Example 30 |
|---|---|---|---|---|---|---|---|
| Ni Amount (% by mass) |  |  |  | 0.20 |  |  |  |
| Cu Amount (% by mass) | 0 | 0.5 | 1.5 | 3 | 5 | 8 | 10 |
| Ductility | X | X | X | X | X | X | X |
| Average Void Ratio (%) | 30% | 32% | 33% | 35% | 36% | 37% | 40% |

TABLE 7-continued

|  | Comparative Example 24 | Comparative Example 25 | Comparative Example 26 | Comparative Example 27 | Comparative Example 28 | Comparative Example 29 | Comparative Example 30 |
|---|---|---|---|---|---|---|---|
| Average of Remaining Ni Thickness (nm) | 290 | 310 | 390 | 555 | 625 | 635 | 645 |

It was found that, in all of Comparative Examples 1 to 30 and Examples 1 to 12 in Tables 2 to 7, there is a tendency that ductility is reduced, the void ratio is increased, and the remaining Ni thickness is increased with an increase in the added amount of Cu.

As shown in FIG. 6, when the added amount of Cu was not less than 3% by mass, the average of the remaining Ni thickness was significantly increased, and the effect of suppressing diffusion of Ni of the metallization layer was obtained. However, as shown in FIG. 7, when the added amount of Cu was not less than 10% by mass, voids were significantly increased. Considering these results, it was found that highly reliable joining is obtained by adding 3 to 8% by mass of Cu to an alloy based on Sn-10Sb-1In.

Further, as shown in FIG. 6, with an increase in the added amount of Ni, the average of the remaining Ni thickness was increased. It was significantly observed when the added amount of Ni was not less than 0.01% by mass. On the other hand, as shown in FIG. 7, when the added amount of Ni was not less than 0.2% by mass, voids were significantly increased. Since increased voids are disadvantageous to release heat generated in the semiconductor device, at present an added amount of not more than about 0.15% by mass serves as a guideline. Therefore, it was shown that highly reliable joining is obtained by controlling the added amount of Ni to be not more than 0.15% by mass. As to the lower limit of the added amount of Ni, not less than 0.01% by mass where the onset of an effect was confirmed is desirable, although an effect is also obtained even if the lower limit thereof is less than 0.01% by mass.

It was confirmed that exactly the same effect was also obtained in experiments similar to the above performed with the added amount of Sb being set to 5% by mass and 15% by mass. Further, exactly the same effect was also obtained in experiments similar to the above performed using silicon chips having several different sizes and metallized chips. Furthermore, exactly the same effect was also obtained in experiments similar to the above performed using SiC (silicon carbide) and GaN (gallium nitride) chips.

Example 3

Next, 10 semiconductor devices manufactured by the manufacturing method described above were experimentally produced for each composition (Comparative Examples 1 to 30, Examples 1 to 12), and heat cycle treatment of 500 cycles was performed, where one cycle included cooling at −50° C. for 30 minutes and heating at 200° C. for 30 minutes. Table 8 shows results of presence or absence of a chip fracture obtained by surface observation, for these semiconductor devices. Table 8 also shows results of the crack ratio and an average value of the remaining Ni thickness obtained by observation with an electron microscope, for these semiconductor devices whose cross sections were polished along the diagonal line of the chip. In a case where there is a chip fracture, a mark x is described as a mark indicating NG, and in a case where there is no fracture, a mark ○ is described as a mark indicating OK. Further, in a case where a chip is fractured, the crack ratio is described as 100%.

TABLE 8

|  | Comparative Example 1 | Comparative Example 2 | Comparative Example 3 | Comparative Example 4 | Comparative Example 5 | Comparative Example 6 | Comparative Example 7 |
|---|---|---|---|---|---|---|---|
| Ni Amount (% by mass) |  |  |  | 0 |  |  |  |
| Cu Amount (% by mass) | 0 | 0.5 | 1.5 | 3 | 5 | 8 | 10 |
| Chip Fracture | X | X | X | X | ○ | ○ | ○ |
| Average Crack Ratio (%) | 100% | 100% | 100% | 100% | 90% | 90% | 100% |
| Average of Remaining Ni Thickness (nm) | 0 | 0 | 0 | 0 | 5 | 7 | 50 |

TABLE 9

|  | Comparative Example 8 | Comparative Example 9 | Comparative Example 10 | Example 1 | Example 2 | Example 3 | Comparative Example 11 |
|---|---|---|---|---|---|---|---|
| Ni Amount (% by mass) |  |  |  | 0.01 |  |  |  |
| Cu Amount (% by mass) | 0 | 0.5 | 1.5 | 3 | 5 | 8 | 10 |
| Chip Fracture | X | X | X | ○ | ○ | ○ | ○ |
| Average Crack Ratio (%) | 100% | 100% | 100% | 50% | 40% | 50% | 100% |

TABLE 9-continued

|  | Comparative Example 8 | Comparative Example 9 | Comparative Example 10 | Example 1 | Example 2 | Example 3 | Comparative Example 11 |
|---|---|---|---|---|---|---|---|
| Average of Remaining Ni Thickness (nm) | 0 | 0 | 0 | 13 | 42 | 49 | 60 |

TABLE 10

|  | Comparative Example 12 | Comparative Example 13 | Comparative Example 14 | Example 4 | Example 5 | Example 6 | Comparative Example 15 |
|---|---|---|---|---|---|---|---|
| Ni Amount (% by mass) |  |  |  | 0.05 |  |  |  |
| Cu Amount (% by mass) | 0 | 0.5 | 1.5 | 3 | 5 | 8 | 10 |
| Chip Fracture | X | X | X | ○ | ○ | ○ | ○ |
| Average Crack Ratio (%) | 100% | 100% | 100% | 40% | 35% | 45% | 100% |
| Average of Remaining Ni Thickness (nm) | 0 | 0 | 0 | 15 | 46 | 53 | 60 |

TABLE 11

|  | Comparative Example 16 | Comparative Example 17 | Comparative Example 18 | Example 7 | Example 8 | Example 9 | Comparative Example 19 |
|---|---|---|---|---|---|---|---|
| Ni Amount (% by mass) |  |  |  | 0.1 |  |  |  |
| Cu Amount (% by mass) | 0 | 0.5 | 1.5 | 3 | 5 | 8 | 10 |
| Chip Fracture | X | X | X | ○ | ○ | ○ | ○ |
| Average Crack Ratio (%) | 100% | 100% | 100% | 30% | 25% | 35% | 100% |
| Average of Remaining Ni Thickness (nm) | 0 | 0 | 0 | 24 | 53 | 64 | 70 |

TABLE 12

|  | Comparative Example 20 | Comparative Example 21 | Comparative Example 22 | Example 10 | Example 11 | Example 12 | Comparative Example 23 |
|---|---|---|---|---|---|---|---|
| Ni Amount (% by mass) |  |  |  | 0.15 |  |  |  |
| Cu Amount (% by mass) | 0 | 0.5 | 1.5 | 3 | 5 | 8 | 10 |
| Chip Fracture | X | X | X | ○ | ○ | ○ | ○ |
| Average Crack Ratio (%) | 100% | 100% | 100% | 30% | 25% | 35% | 100% |
| Average of Remaining Ni Thickness (nm) | 0 | 0 | 0 | 41 | 68 | 77 | 85 |

TABLE 13

| | Comparative Example 24 | Comparative Example 25 | Comparative Example 26 | Comparative Example 27 | Comparative Example 28 | Comparative Example 29 | Comparative Example 30 |
|---|---|---|---|---|---|---|---|
| Ni Amount (% by mass) | | | | 0.20 | | | |
| Cu Amount (% by mass) | 0 | 0.5 | 1.5 | 3 | 5 | 8 | 10 |
| Chip Fracture | X | X | X | ○ | ○ | ○ | ○ |
| Average Crack Ratio (%) | 100% | 100% | 100% | 100% | 100% | 100% | 100% |
| Average of Remaining Ni Thickness (nm) | 0 | 0 | 0 | 47 | 73 | 86 | 90 |

Referring to Table 8, in the semiconductor devices of Comparative Examples 1 to 4 joined using solder alloys produced by adding no Ni and adding Cu in the range of 0 to 3% by mass to an Sn-10Sb-1In solder alloy, Ni as the metallization layer did not remain as a result of 500 heat cycles, and thereby a chip fracture occurred. Further, in the semiconductor devices of Comparative Examples 5 and 6 joined using solder alloys produced by adding 5% by mass or 8% by mass of Cu, although the Ni metallization layer partially remained, a crack ran quickly in a portion where the Ni metallization layer did not remain, resulting in a very high crack ratio. Furthermore, in the semiconductor device of Comparative Example 7 joined using a solder alloy produced by adding 10% by mass of Cu, since there were many voids in a solder junction, a crack ran quickly and was formed in a penetrating state, although no chip fracture occurred.

In addition, referring to Table 9, in the semiconductor devices of Comparative Examples 8 to 10 joined using solder alloys produced by adding 0.01% by mass of Ni and not more than 1.5% by mass of Cu, Ni of the metallization layer was diffused as a result of the heat cycles, and thereby adhesion force was reduced and a chip fracture occurred. Further, in the semiconductor device of Comparative Example 11 joined using a solder alloy produced by adding 10% by mass of Cu, since there were many voids, a crack ran quickly and penetrated. In Examples 1 to 3 in which the added amount of Cu was 3 to 8% by mass, no chip fracture occurred, and the crack ratio was not more than 50%.

In addition, in the semiconductor devices of Comparative Examples 12, 13, 14, 16, 17, 18, 20, 21, and 22 joined using solder alloys produced by adding 0.05 to 0.15% by mass of Ni and not more than 1.5% by mass of Cu to an Sn10Sb alloy, the Ni metallization layer did not remain irrespective of the added amount of Ni, and a chip fracture occurred. Further, in the semiconductor devices of Comparative Examples 15, 19, and 23 joined using solder alloys produced by adding 0.05 to 0.15% by mass of Ni and 10% by mass of Cu to an Sn10Sb1In alloy, although the Ni metallization layer remained, there were many voids in a solder junction, and thus a crack ran quickly and penetrated.

In addition, in the semiconductor devices of Comparative Examples 24 to 30 joined using solder alloys produced by adding 0.2% by mass of Ni, since there were many voids in a solder junction, a crack ran quickly and penetrated. Further, in Comparative Examples 24 to 26 in which the added amount of Cu was not more than 1.5% by mass, a chip fracture occurred.

Based on the examples described above, it was found that, by adding 0.01 to 0.15% by mass of Ni and 3 to 8% by mass of Cu to an Sn-10Sb-1In solder alloy, highly reliable joining can be performed, and a highly reliable semiconductor device can be provided.

It was confirmed that exactly the same effect was also obtained in experiments similar to the above performed using solder alloys in which the added amount of Sb was changed in the range of 5 to 15% by mass, and the added amount of In was changed in the range of 0.5 to 5% by mass.

Example 4

Figure 8:
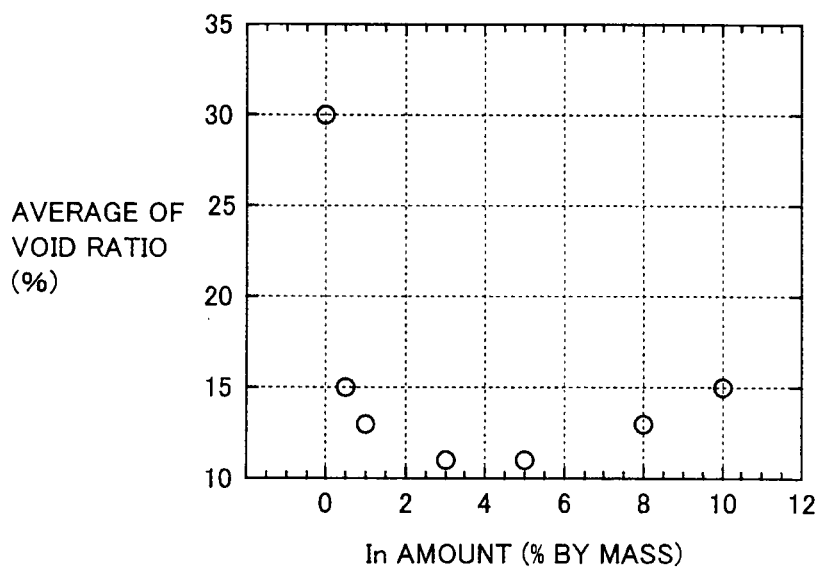
FIG. 8 is a view showing the relationship between In amount and the average of the void ratio.

Table 14 shows void ratios when solder alloy pellets produced by adding 0, 0.5, 1, 3, 5, 8, and 10% by mass of In to an Sn-12Sb-5Cu-0.08Ni solder alloy were manufactured to manufacture semiconductor devices similar to those described above. Further, the ratio of cost was calculated as a ratio between the price of an In-added alloy and the price of an In-free alloy, based on the assumption that the price of Sn-12Sb-5Cu-0.08Ni was 3000 yen per kg and the price of indium was 60000 yen per kg. FIG. 8 is a view showing the relationship between In amount and the average of the void ratio in Example 4.

TABLE 14

| | Comparative Example 31 | Example 21 | Example 22 | Example 23 | Example 24 | Comparative Example 32 | Comparative Example 33 |
|---|---|---|---|---|---|---|---|
| In Amount (% by mass) | 0 | 0.5 | 1 | 3 | 5 | 8 | 10 |
| Void Ratio (%) | 30% | 15% | 13% | 11% | 11% | 13% | 15% |
| Ratio of Cost per kg | 1 | 1.1 | 1.2 | 1.6 | 2.0 | 2.6 | 3.0 |

It was confirmed that exactly the same effect was also obtained in experiments similar to the above performed with Sb being set to 5 to 15% by mass, Cu being set to 3 to 8% by mass, Ni being set to 0.01 to 0.15% by mass, and Sn being included as the remainder.

Example 5

Solder alloys to which at least one selected from the group consisting of P, Ge, Ga, and Bi was added by 0.01 to 1% by mass in total were manufactured as solder layer 3 according to the present embodiment described above. Then, semiconductor device 1 including circuit board 4 as the metal electrode connected to silicon chip 2 as the semiconductor element via the solder alloy was manufactured under conditions identical to those described above, and a void ratio thereof was measured. As a result, an improvement effect of 2 to 10% was observed in all the solder alloys.

It is to be noted that, in a solder alloy containing at least one selected from the group consisting of P, Ge, Ga, and Bi, by 0.005% by mass in total, it was not possible to confirm a significant improvement effect. Further, in solder alloys containing at least one selected from the group consisting of P, Ge, Ga, and Bi, by 1.5% by mass and 3% by mass in total, the void ratio showed a tendency to be increased on the contrary.

Example 6

A semiconductor device using an Sn-6Cu solder alloy pellet (Comparative Example 34) was produced by a manufacturing method identical to that of the embodiment of the present invention. This sample and semiconductor device 1 of Example 8 were subjected to heat cycle treatment of 500 cycles, where one cycle included cooling at −50° C. for 30 minutes and heating at 200° C. for 30 minutes.

Figure 9:
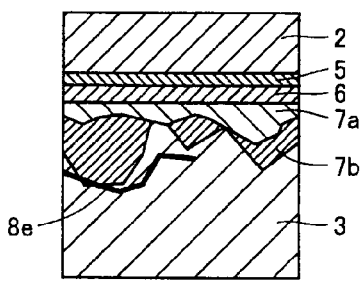
FIG. 9 is a schematic cross sectional view simulated based on a result of qualitative analysis on a joined interface between the metallization layer and the solder layer of the silicon chip obtained by observing a cross section subjected to heat cycle treatment, using an electron microscope and characteristic X-rays, in which FIG. 9(A) corresponds to Comparative Example 34 and FIG. 9(B) corresponds to Example 8.
Figure 9:
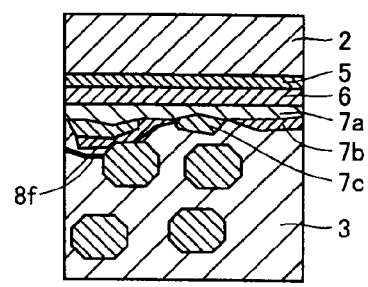
Figure 10:
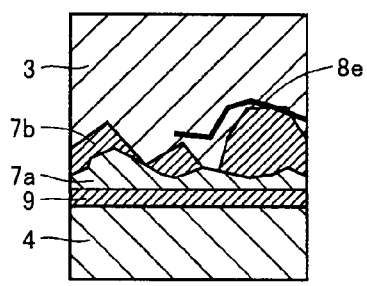
FIG. 10 is a schematic cross sectional view simulated based on a result of qualitative analysis on a joined interface between the solder layer and an Ni plating layer obtained by observing a cross section subjected to heat cycle treatment, using an electron microscope and characteristic X-rays, in which FIG. 10(A) corresponds to Comparative Example 34 and FIG. 10(B) corresponds to Example 8.
Figure 10:
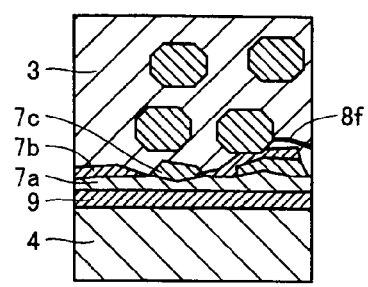

In Comparative Example 34 shown in FIG. 9(A), a Cu—Ni—Sn phase 7a and a Cu—Sn phase 7b are present in alloy layer 7 between silicon chip 2 and solder layer 3. Further, in Comparative Example 34 shown in FIG. 10(A), Cu—Ni—Sn phase 7a and Cu—Sn phase 7b are present in alloy layer 7 between Ni plating layer 9 formed on the surface of circuit board 4 and solder layer 3. Due to thermal stress generated by a difference in thermal expansion coefficient between silicon chip 2 and circuit board 4, a crack 8e occurred along an interface between relatively soft solder layer 3 and Cu—Sn phase 7b, and ran at a relatively quick rate.

On the other hand, in Example 8 shown in FIG. 9(B), an Sb containing phase 7c is present, in addition to Cu—Ni—Sn compound phase (phase containing copper, nickel, and tin) 7a and Cu—Sn compound phase (phase containing copper and tin) 7b, in alloy layer 7 between silicon chip 2 as the semiconductor element and solder layer 3 as the solder alloy. Further, in Example 8 shown in FIG. 10(B), Sb containing phase 7c is present, in addition to Cu—Ni—Sn compound phase 7a and Cu—Sn compound phase 7b, in alloy layer 7 between Ni plating layer 9 formed on the surface of circuit board 4 as the metal electrode and solder layer 3 as the solder alloy. Since Sb containing phase 7c has a high mechanical strength, if a crack 8f hits on this phase, stress is dispersed and the crack runs slowly. Further, since Sb containing phase 7c is precipitated in the vicinity of Cu—Ni—Sn compound phase 7a and Cu—Sn compound phase 7b, Cu—Sn compound phase 7b is dispersed uniformly and there are less stress-concentrated locations, and thus the crack runs slowly. Thereby, reliability is further improved.

It is to be noted that, in order to obtain such a structure, it is necessary to perform joining in semiconductor device 1 used this time at a cooling rate of not more than 30° C./min. Rapid cooling at a rate faster than the above rate results in a nonuniform structure, and makes it impossible to obtain a significant effect.

Example 7

Experiments similar to those of the embodiment described above were performed, using Cu/Inver/Cu and Cu/Mo/Cu as the circuit board. Layers in Cu/Inver/Cu have thicknesses of 0.4 mm, 0.4 mm, and 0.4 mm, respectively. In addition, layers in Cu/Mo/Cu have thicknesses of 0.4 mm, 0.4 mm, and 0.4 mm, respectively.

It was confirmed that the crack ratio in Cu/Inver/Cu is about half, and the crack ratio in Cu/Mo/Cu is about one third. Further, a similar experiment was performed for a case where Ni plating was not applied on the surface of the circuit board, including the case where Cu is used as the circuit board, and both the crack ratio and diffusion of the metallization were improved by about 20%.

As described above, it was confirmed that effects can be obtained irrespective of an electrode material and surface treatment.

It is to be noted that the present invention is applicable to any semiconductor device mounted to a module, a package, or a substrate.

It should be understood that the embodiments and examples disclosed herein are illustrative and non-restrictive in every respect. The scope of the present invention is defined by the scope of the claims, rather than the above description, and is intended to include any modifications within the scope and meaning equivalent to the scope of the claims.

INDUSTRIAL APPLICABILITY

The present invention is particularly advantageously applicable to a solder alloy not containing lead and a semiconductor device using the solder alloy.

DESCRIPTION OF THE REFERENCE SIGNS

1: semiconductor device, 2: silicon chip (semiconductor element), 3: solder layer (solder alloy), 4: circuit board, 5: ohmic layer, 6: metallization layer, 7: alloy layer, 7a: Cu—Ni—Sn compound phase, 7b: Cu—Sn compound phase, 7c: Sb containing phase, 8a, 8b, 8e, 8f: crack, 8c: delamination, 8d: fracture, 9: Ni plating layer.

The invention claimed is:
1. A semiconductor device, comprising:
a semiconductor element;
a metal electrode joined to the semiconductor element with a solder alloy interposed therebetween, and
an alloy layer comprising a compound phase comprising Cu—Ni—Sn, a compound phase comprising Cu—Sn, and a containing phase comprising Sb, in at least one of a position between the semiconductor element and the solder alloy and a position between the metal electrode and the solder alloy, wherein
the solder alloy comprises:
5 to 15% by mass of Sb;
3 to 8% by mass of Cu;
0.01 to 0.15% by mass of Ni;
0.5 to 5% by mass of In, and
the remainder comprising Sn and unavoidable impurities.
2. The semiconductor device of claim 1, wherein the solder alloy further comprises:
at least one selected from the group consisting of P, Ge, Ga, and Bi, by 0.01 to 1% by mass in total.
3. The semiconductor device of claim 1, wherein the Cu is present in an amount of 3 to 5% by mass.
4. The semiconductor device of claim 2, wherein the Cu is present in an amount of 3 to 5% by mass.
5. The semiconductor device of claim 1, wherein the Ni is present in an amount of 0.01 to 0.1% by mass.
6. The semiconductor device of claim 2, wherein the Ni is present in an amount of 0.01 to 0.1% by mass.

7. The semiconductor device of claim 3, wherein the Ni is present in an amount of 0.01 to 0.1% by mass.

8. The semiconductor device of claim 1, wherein the Ni is present in an amount of 0.05 to 0.1% by mass.

9. The semiconductor device of claim 2, wherein the Ni is present in an amount of 0.05 to 0.1% by mass.

10. The semiconductor device of claim 3, wherein the Ni is present in an amount of 0.05 to 0.1% by mass.

11. The semiconductor device of claim 1, wherein the In is present in an amount of 0.5 to 1% by mass.

12. The semiconductor device of claim 2, wherein the In is present in an amount of 0.5 to 1% by mass.

13. The semiconductor device of claim 3, wherein the In is present in an amount of 0.5 to 1% by mass.

14. The semiconductor device of claim 7, wherein the In is present in an amount of 0.5 to 1% by mass.

15. The semiconductor device of claim 8, wherein the In is present in an amount of 0.5 to 1% by mass.

16. The semiconductor device of claim 10, wherein the In is present in an amount of 0.5 to 1% by mass.

* * * * *